(12) United States Patent
Gaudl et al.

(10) Patent No.: US 9,884,936 B2
(45) Date of Patent: Feb. 6, 2018

(54) PHOTOACTIVE RESINS, RADIATION CURABLE COMPOSITIONS AND RADIATION CURABLE INKS

(71) Applicant: SUN CHEMICAL CORPORATION, Parsippany, NJ (US)

(72) Inventors: Kai-uwe Gaudl, Hohen Neuendorf (DE); Juergen Dieker, Darmstadt (DE)

(73) Assignee: SUN CHEMICAL CORPORATION, Parsippany, NJ (US)

( * ) Notice: Subject to any disclaimer, the term of this patent is extended or adjusted under 35 U.S.C. 154(b) by 571 days.

(21) Appl. No.: 14/357,353

(22) PCT Filed: Nov. 29, 2012

(86) PCT No.: PCT/US2012/067024
§ 371 (c)(1),
(2) Date: May 9, 2014

(87) PCT Pub. No.: WO2013/082262
PCT Pub. Date: Jun. 6, 2013

(65) Prior Publication Data
US 2014/0315002 A1    Oct. 23, 2014

Related U.S. Application Data

(60) Provisional application No. 61/564,421, filed on Nov. 29, 2011.

(51) Int. Cl.
| | |
|---|---|
| *C08G 6/02* | (2006.01) |
| *C08F 16/36* | (2006.01) |
| *G03F 7/027* | (2006.01) |
| *G03F 7/033* | (2006.01) |
| *G03F 7/038* | (2006.01) |
| *C08L 61/02* | (2006.01) |
| *C09D 11/103* | (2014.01) |
| *C09D 11/107* | (2014.01) |
| *C09D 11/101* | (2014.01) |
| *C08F 222/10* | (2006.01) |

(52) U.S. Cl.
CPC .............. *C08G 6/02* (2013.01); *C08F 16/36* (2013.01); *C08L 61/02* (2013.01); *C09D 11/101* (2013.01); *C09D 11/103* (2013.01); *C09D 11/107* (2013.01); *G03F 7/027* (2013.01); *G03F 7/033* (2013.01); *G03F 7/038* (2013.01); *C08F 222/1006* (2013.01); *C08F 2222/1073* (2013.01); *C08F 2222/1093* (2013.01); *Y10T 428/24802* (2015.01)

(58) Field of Classification Search
CPC ...... C08G 6/02; C09D 11/103; C09D 11/107; C09D 11/101; C08F 16/36; C08F 222/1006; G03F 7/033; G03F 7/027; G03F 7/038; Y10T 428/24802

USPC .......................................... 522/105, 1; 520/1
See application file for complete search history.

(56) References Cited

U.S. PATENT DOCUMENTS

| | | | | |
|---|---|---|---|---|
| 2004/0067450 A1* | 4/2004 | Leatherdale | ......... | G02B 6/1221 430/322 |
| 2010/0047454 A1* | 2/2010 | De Voeght | ............... | B41J 2/211 427/256 |
| 2010/0089286 A1* | 4/2010 | Craig | ................... | A61K 6/0005 106/35 |
| 2011/0118408 A1* | 5/2011 | Takayama | ............... | C07C 45/70 524/592 |

FOREIGN PATENT DOCUMENTS

| | | |
|---|---|---|
| CN | 101959926 A | 1/2011 |
| EP | 0063874 A1 | 11/1982 |
| EP | 0389902 A1 | 10/1990 |
| EP | 0827032 A2 | 3/1998 |
| JP | 2005272728 A | 10/2005 |

OTHER PUBLICATIONS

Hrdlovic et al, Photochemical Addition of Maleic Anhydride Derivatives and Related Compounds to Benzene and POlystyrene Sensitized by Low- and High molecular carbonyls, 1978, Jounral of Polymer Science: Polymer Chemistry Edition, vol. 16, 877-888.*
Chinese Office Action from Chinese Application No. 201280057694.1 dated May 11, 2015.
Chinese Office Action issued in Chinese Application No. 201280057694.1 dated Jan. 19, 2016 (with English Language Translation).
Japanese Office Action issued in Japanese Application No. 2014-544877, dated Jul. 11, 2016 (with English Language Translation).
Notification Concerning Transmittal of International Preliminary Report on Patentability (Chapter 1 of the Patent Cooperation Treaty) issued in PCT/US2012/067024, dated Jun. 12, 2014.
International Search Report dated May 14, 2013 in connection with International Application No. PCT/US2012/067024 filed Nov. 29, 2012.

* cited by examiner

*Primary Examiner* — Jessica Whiteley
(74) *Attorney, Agent, or Firm* — Charles C. Achkar; Ostrolenk Faber LLP.

(57) ABSTRACT

The present invention is directed to photoactive resins employed in radiation curable compositions and ink. The radiation curable compositions include mono or multi-functional acrylates, an amine and the above-mentioned photoactive resin. Radiation curable inks at least include the components of the radiation curable composition in addition to colorants.

27 Claims, 1 Drawing Sheet

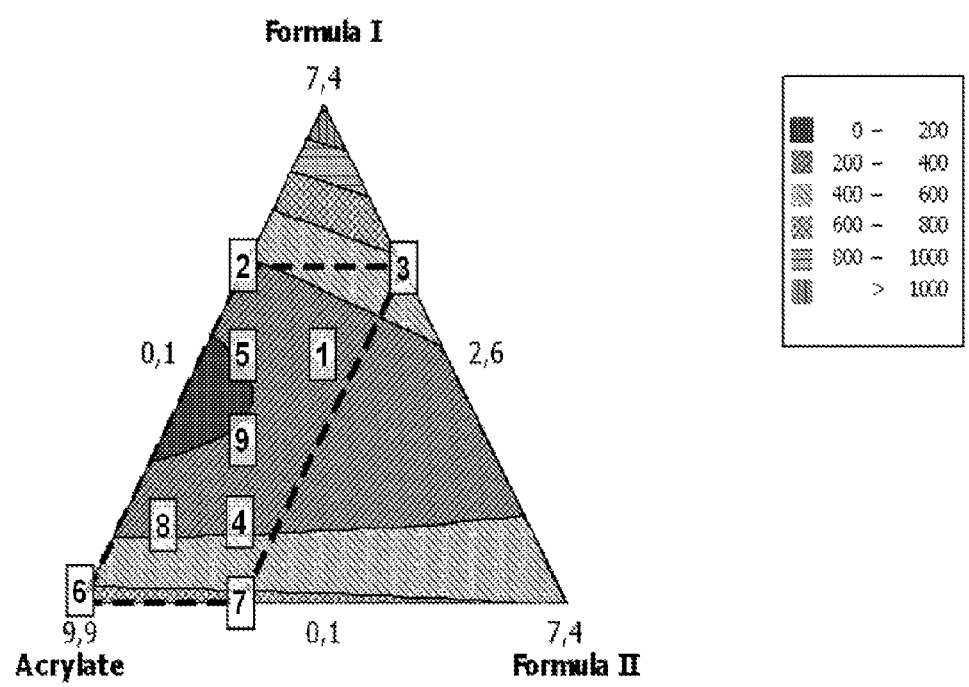

PHOTOACTIVE RESINS, RADIATION CURABLE COMPOSITIONS AND RADIATION CURABLE INKS

This application is a §371 National Phase application based on PCT/US2012/067024 filed on Nov. 29, 2012, and claims the benefit of U.S. Provisional Patent Application No. 61/564,421 filed Nov. 29, 2011, which hereby is incorporated by reference for all purposes as if fully set forth herein.

BACKGROUND OF THE INVENTION

Field of the Invention

Generally, the present invention is directed to novel photoactive resins. The present invention also is directed to radiation curable compositions including photoactive resins in combination with an amine and an acrylate. The present invention further is directed to radiation curable inks including pigments, radiation curable compositions and additives.

Description of the Related Art

Radiation curable compositions are distinct from other compositions. Namely radiation curable compositions have the ability to change state almost instantaneously from the fluid phase to a highly cross-linked solid phase via a chemical reaction. The chemical reaction generally is initiated by a radiation source such as ultraviolet light or high-energy electron beams.

From a commercial context, the speed at which radiation curable compositions are cured is important. For example, in the field of packaging faster caring of a radiation curable composition on a substrate results in increased throughput. By so doing, significant cost savings are obtained in view of reduced production and printing time.

Radiation curable compositions typically include a polymerizable compound. The polymerizable compound generally includes monomers such as monomeric, oligomeric or polymeric, mono- of multifunctional acrylates. Depending upon the application of the radiation curable compositions, such as, for example fast curing applications, the additives may include one or more photoinitiators to initiate free radical polymerization of the acrylate. By so doing, the radiation curable composition ultimately is hardened into a dry and solid film.

In recent years, regulations in developed countries have become more stringent with respect to migration levels of components in radiation curable compositions and inks. For example, certain classes of photoinitiators are highly prone to migration caused by unreacted and residual photoinitiator amounts. Specifically, photoinitiators having a molecular weight less than 500 Daltons are susceptible to migration resulting in odor and toxicity problems in packaging applications. Migration is common in Type 1 photoinitiators, such as, for example alpha-aminoacetophenones, which split upon irradiation and form even smaller molecules.

A need thus exists for radiation curable compositions and inks including little if any photoinitiator components which are prone to migration.

A need also exists for radiation curable compositions and inks exhibiting improved curing properties.

SUMMARY OF THE INVENTION

It has surprisingly been found by the inventors of the present invention that their novel, photoactive resins used in radiation curable compositions and inks improve cure properties. These photoactive resins also reduce migration of low molecular weight photo initiators. Specifically, the photoactive resins of the present invention together with acrylates and amines form a radiation curable composition. By so doing, the inventive radiation curable composition of the present invention provides structure through cross-linking and entanglements.

The radiation curable composition of the present invention can be used in many applications including but not limited to coatings, adhesives, packaging, and molded articles. In an exemplary embodiment, the radiation curable composition is suitable for use food packaging applications.

According to one aspect of the invention, there is described a novel, photoactive resin. The resin includes an aromatic ketone monomer including a biphenyl moiety. The resin also includes a chain ending group selected from hydrogen, a methylol group and mixtures thereof.

According to another aspect of this invention, there is described a radiation curable composition including the above-mentioned photo active resin. The composition also includes a mono or multi-functional acrylate. The composition further includes an amine. In one embodiment, the radiation curable composition includes photoinitiators. In another embodiment, the ink contains less than about 1 wt. % of splitting, type I photoinitiators.

According to yet another aspect of this invention, there is described a radiation curable printing ink including the above-mentioned photoactive resin. The ink also includes a mono or multi-functional acrylate, an amine, and a colorant. In one embodiment, the ink comprises photo initiators. In another embodiment, the ink contains less than about 1 wt. % of splitting, type I photo initiators.

A further aspect of the present invention describes a UV printed article including the above-mentioned energy curable lithographic printing ink applied onto a surface of a substrate.

Additional features and advantages of the present invention will be set forth in the description which follows, and in part will be apparent from the description, or may be learned by practice of the invention. The advantages of the invention will be realized and attained by the structure particularly pointed out in the written description and claims hereof as well as the appended drawings.

BRIEF DESCRIPTION OF THE DRAWING

The accompanying drawing, which is included to provide a further understanding of the invention and are incorporated in and constitute a part of this specification, illustrate embodiments of the invention and together with the description serve to explain the principles of the invention.

In the Drawing

FIG. 1 illustrates a tertiary phase diagram of radiation curable compositions according to the present invention.

DETAILED DESCRIPTION OF THE INVENTION

Reference will now be made in detail to the embodiments of the present invention, and examples of which are illustrated in the accompanying FIGURE(s).

The inventors have surprisingly discovered novel, photoactive resins which can be employed in radiation curable compositions. For purposes of this application, radiation curable compositions are also defined as varnishes and interchangeably used throughout. Specifically, the novel, photoactive resins employed in radiation curable compositions applied on substrates require considerably less cure dose in mJ/cm to obtain optimal cure results for packaging applications. An improvement in cure speed is realized. According to the inventors, the improvement in cure speed and smaller UV cure dose of the inventive composition is attributed to the biphenyl ketone moieties present in the photoactive resin which can be excited by UV-light and form highly effective radicals together with amines and promote fast polymerization of acrylates. Polymerization is defined herein as curing.

The radiation curable compositions are generally employed in commercial packaging applications. In an exemplary embodiment, the packages contain foodstuffs. For at least these reasons, low migration compositions are desired to prevent articles, such as foodstuffs, from contamination via odors or toxicities. From a commercial standpoint, these drawbacks significantly affect product appeal and often can deter customers from purchasing these products cause by odor or toxicity concerns attributed to the packaging. In an exemplary embodiment, the inventors of the present invention show that little or no migratable components, such as monomeric photoinitiators, are required in their inventive radiation curable compositions and inks. According to the inventors, their inventive photoactive resins provide sufficient cure for highly pigmented inks therefore eliminating the need for employing low molecular weight photoinitiators prone to migration.

In another embodiment, the radiation curable compositions may be employed as a coating on wood applications. The adhesive compositions may also be used in a variety of other industrial applications. In one embodiment, the adhesives are used in food packaging applications. In another embodiment, the adhesives are used in non-food packaging applications. In an exemplary embodiment, the adhesives are used in self-adhesive labels. In an alternative, exemplary embodiment, the adhesives are used in paper labels. In a further exemplary embodiment, the adhesives are used in pharmaceutical packaging applications. In yet a further exemplary embodiment, the adhesives are used in cosmetic packaging applications. In yet another exemplary embodiment, the adhesives are used in luxury packaging. In another exemplary embodiment the adhesives are used in holograms or hologram foils. In another embodiment, the adhesives are used wrapping paper, book covers, greeting cards, business cards or magazine coves.

The energy source used for achieving polymerization and/or cross-linking of the curable functionality may be actinic, e.g., radiation having a wavelength in the ultraviolet or visible region of the spectrum, accelerated particles, e.g., electron beam radiation, thermal, e.g., heat or infrared radiation, or the like. Preferably, the energy is actinic radiation or accelerated particles, because such energy provides excellent control over the initiation and rate of polymerization and/or cross-linking. Additionally, actinic radiation and accelerated particles can be used for curing at relatively low temperatures. This avoids degrading or evaporating components that might be sensitive to the relatively high temperatures required to initiate polymerization and/or cross-linking of the energy curable groups when using thermal curing techniques. Suitable sources of curing energy include lasers, electron beams, mercury lamps, xenon lamps, carbon are lamps, tungsten filament lamps, sunlight, low intensity ultraviolet light (black light), and the like.

In an exemplary embodiment, the radiation curable compositions of the present invention can be UV-cured by an actinic light source, such as for example UV-light, provided by a high-voltage mercury bulb, a medium-voltage mercury bulb, a xenon bulb, a carbon arc lamp, a metal halide bulb, a UV-LED lamp or sunlight. The wavelength of the applied irradiation is preferably within a range of about 200 to 500 nm, more preferably about 250 to 350 nm. UV energy is preferably within a range of about 30 to 3,000 mJ/cm$^2$, and more preferably within a range of about 50 to 500 mJ/cm$^2$. In addition, the bulb can be selected according to the absorption spectrum of the radiation curable composition.

In an another exemplary embodiment, the radiation curable compositions and inks of this invention can be cured by electron beam (EB). Commercially EB-dryers are available for example from Energy Science, Inc. of Wilmington, Mass., or from Advanced Electron Beams Inc. of Wilmington, Mass. The energy absorbed, also known as the dose, is measured in units of kiloGrays (kGy), one kGy being equal to 1,000 Joules per kilogram. Usually, the electron beam dose should be within the range of 10 kGy to about 40 kGy for complete curing. With the radiation curable composition of this invention a radiation dose of 20-30 kGy at an oxygen level of <200 ppm is usually sufficient to get a dry, solvent resistant coating or ink.

Photoactive Resin

According to a first aspect of this invention, the photoactive resin is characterized as having an aromatic ketone monomer in combination with an aldehyde monomer. As used herein, the term "monomer" is defined as a relatively low molecular weight material, i.e., having a molecular weight less than about 500 g/mole, and having one or more polymerizable groups. "Oligomer" is defined as a relatively intermediate molecular weight material having a molecular weight of from about 500 up to about 10,000 g/mole. "Polymer" is defined as a relatively high molecular weight material having a molecular weight of at least about 10,000 g/mole, preferably at 10,000 to 100,000 g/mole. The term "molecular weight" as used throughout this specification means number average molecular weight, unless expressly noted otherwise.

The compounds of the general formula are typically made from ketone monomers and aldehyde monomers by condensation. An example of the condensation reaction product is provided as Formula I below:

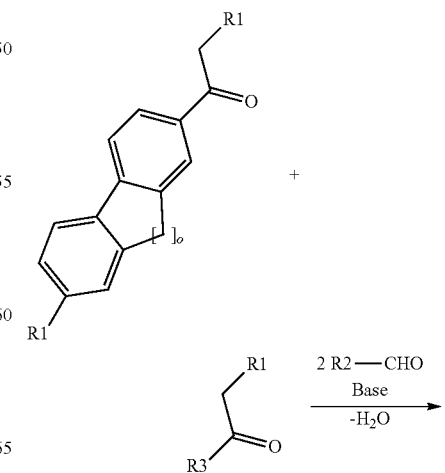

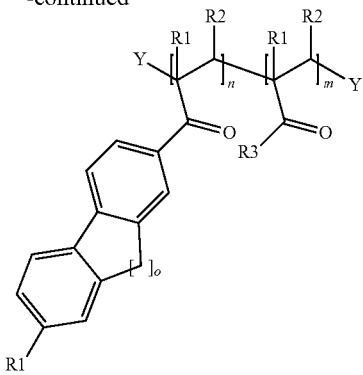

Formula I wherein,

R1 is selected from hydrogen, a branched alkyl radical having 1 to 12 carbon atoms an unbranched alkyl radical having 1 to 12 carbon atoms, a branched aryl radical having 1 to 12 carbon atoms, and an unbranched aryl radical having 1 to 12 carbon atoms.

R2 is selected from hydrogen, a branched alkyl radical having 1 to 12 carbon atoms, an unbranched alkyl radical having 1 to 12 carbon atoms, a branched aryl radical having 1 to 12 carbon atoms, and an unbranched aryl radical having 1 to 12 carbon atoms.

R3 is selected from a substituted, bridged aryl radical having 1 to 20 carbon atoms, a substituted, unbridged aryl radical having 1 to 20 carbon atoms, an unsubstituted, bridged aryl radical having 1 to 20 carbon atoms, an unsubstituted, unbridged, aryl radical having 1 to 20 carbon atoms, a substituted, bridged alkyl radical having 1 to 20 carbon atoms, a substituted, unbridged alkyl radical having 1 to 20 carbon atoms, an unsubstituted, bridged alkyl radical having 1 to 20 carbon atoms, and an unsubstituted, unbridged, alkyl radical having 1 to 20 carbon atoms.

Y is a chain ending group selected from hydrogen or a methylol group (CH2-OH group), m is an integer of 0-50, n is an integer of 1-50, and o is an integer of 0, 1 or 2.

In one embodiment, condensation of the aldehydes and ketones usually takes place under alkaline conditions. Strong alkaline bases, such as for example potassium, sodium hydroxide, methoxides and the like, are most commonly employed. Quaternary ammonium salts are employed for particularly high melting resins. In another embodiment, strong acids such as sulfuric acid or dehydration salts such as zinc chloride are employed.

Condensation takes place at temperatures between about 25-100° C. and is otherwise described in literature as for example in Journal of Applied Polymer Science, Vol. 50 (1996) pages 577-584 and Journal of Applied Polymer Science, Vol. 60 (1996) pages 465-476. The required formaldehyde is normally used in the form of an approximately 30-37 wt. % aqueous solution or paraformaldehyde. Once an excess of formaldehyde is used, methylol groups (—CH2-OH) may occur as end groups indicated with group Y in formula I.

After synthesis, the polymers are preferably purified to remove unreacted monomers, residues of bases and formaldehyde, preferably by washing with hot water or treatment with steam and finally dried.

The obtained resin of the general formula I are typically colorless to yellow solids and preferably exhibit a weight-average molecular weight (Mw) within the range of about 500-5,000. In an exemplary embodiment, the range is 800-2,000. The resin has a preferred glass transition temperature (Tg) of about 20-80° C., a preferred softening point of about 60-140° C., and preferably is soluble in the most common solvents and acrylates.

Alternatively, although commercially less practical, the compounds of the general formula I can be made by polymerizing aliphatic and aromatic vinyl ketones, in the presence of a radical initiator, such as dibenzoyl peroxide, for example:

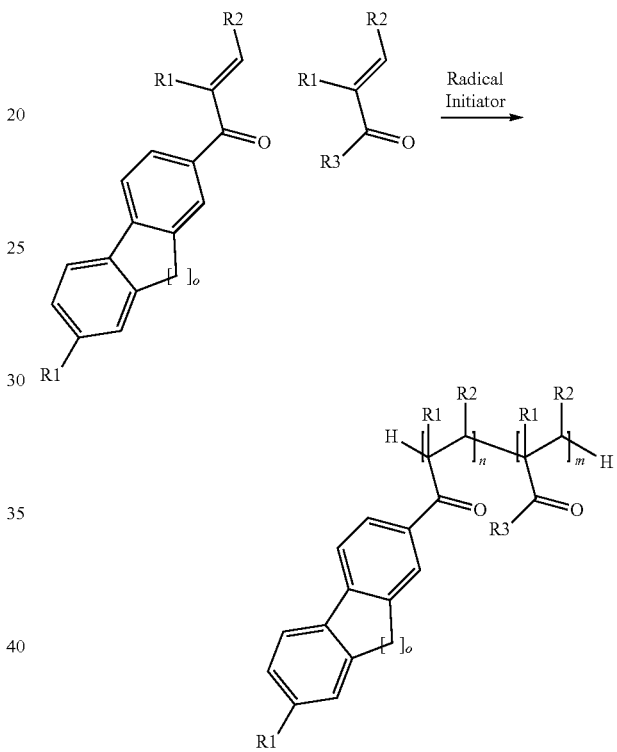

Vinyl ketones can be made according to literature as explained by Alfred Claus, Dissertation ETH 6445, Eidgenoessische Technische Hochschule Zurich, 1979.

The ketone monomers for making the novel photoactive resin disclosed above includes but is not limited to the following monomers: acetone, methyl ethyl ketone, heptan-2-one, pentan-3-one, methyl isobutyl ketone, cyclopentanone, cyclohexanone, 3-methyl-cyclohexanone, acetophenone, 2-methyl-acetophenone, 3-methyl-acetophenone, 4-methyl acetophenone, 4-ethyl-acetophenone, F propiophenone, 4-tert-butyl-acetophenone, 4-cyclohexyl-acetophenone 2-phenyl-acetophenone, 3-phenyl-acetophenone, 4-phenyl-acetophenone, 4-tert-butyl-acetophenone, 4-cyclohexyl-acetophenone, 2-phenyl-propiophenone, 3-phenyl-propiophenone 4-phenyl-propiophenone, 2-acetylfluorene, 3-acetylfluorene, 4'-methyl-4-acetyl-biphenyl, 4'-phenyl-4-acetyl-biphenyl and mixtures thereof.

The aldehyde monomers employed in the novel photoactive resin include but are not limited to the following: formaldehyde, acetaldehyde, n-butyraldehyde, valeraldehyde, dodecanal, benzaldehyde and mixtures thereof, in an exemplary embodiment formaldehyde is preferred.

According to a second aspect of the present invention, there is described the synthesis of a ketone resin of the general Formula I referred hereinafter as Example 1. Specifically, 49.8 g (0.25 mol) of 4-acetylbiphenyl, 30 g (0.25 mol) of acetophenone, 330 ml (8.16 mol) of methanol, and 15.0 g (0.18 mol) of formaldehyde (37% wt % in water) are introduced to a four-necked flask and heated therein with stirring under a nitrogen atmosphere to 60-65° C. Thereafter, 16 g of sodium hydroxide solution (25 wt. %) is added, and the reaction mixture is heated to 67° C. Within 30 minutes, 26.8 g (0.33 mol) of formaldehyde (37 wt. % in water) is added and the reaction mixture is then heated to 69-75° C. and left under reflux for 5 hr. The excess of methanol/water is removed by condensation using a phase separating head (three drop removed/one drop remains) up to an inner temperature of the refluxing media of 82° C. (~320 ml collected). The obtained solid is dried in vacuum.

For further purification, the brittle grayish, yellow resin is then suspended in 200 ml water, stirred for 20 minutes and filtered. This washing procedure is repeated until the washed water is neutral. The dried resin is dissolved in a small amount of ethyl acetate (115 ml for 100 g). The turbid, yellow solution is filtered again. The clear filtrate is re-precipitated by drop-wise addition of the solution to methanol (1000 ml methanol for 100 g) resulting in a white precipitate. The obtained solid is filtered and dried, resulting in a slightly yellowish, clear and brittle resin.

The resin had a number average molecular weight (Mn) of 790 and a mass average molecular weight (Mw) of 990. This was determined by size exclusion chromatography (GPC) with a monodisperse polystyrene equivalent molecular weight calibration standard and GPC columns (manufactured by PSS (Polymer Standards Service-USA, Inc), applied column combination: SDV 5 µm 1000 Å, SDV 5 µm 500 Å, SDV 5 µm 100 Å). The flow rate in the columns is 1.0 ml/min, eluent: tetrahydrofurane, column temperature: 40° C., a differential refractive index detector (RI) and a UV-detector (254 nm) were used. The dispersibility DISP=(Mw/Mn) is the quotient of molecular weight average and number average and was calculated from the measurement results.

UV-Absorption: $\lambda_{max}$ (n–π*)=297 nm:

Spectra were acquired using a Unicam UV2 UV/VIS spectrophotometer. All absorption spectra were obtained using 1 cm cuvettes, scanning within the 200-800 nm range. Solutions of $10^{-4}$ mol·dm$^{-3}$ in THF were prepared in a 100 cm$^3$ volumetric flask, and, if required, subsequently diluted by a factor of ten so as to obtain a maximum absorbance of less than 1.

Glass Transition Temperature (Tg)=54° C.

Differential Scanning Calorimetry (DSC) was used to measure the glass transition temperature Tg of small samples (10-20 mg). Heat up rates are 10° C./min. in a sealed pan under nitrogen atmosphere. All samples were subjected to two scans starting at room temperature and ending at an appropriate temperature well above the Tg. Measurement of glass transition temperature was performed by using a differential scanning calorimeter DSC-7 from Perkin-Elmer provided with the temperature control stage.

Color: 2 Gardner.

Color of the resins was measured using the Lovibond 2000 Comparator with Daylight colour measuring system. The sample (50 wt.-% solution in toluene) is visually matched against calibrated, color stable glass standards in test discs. The scale discs color standards used were the Gardner 4/30AS (with the colours 1 to 9) and the Gardner 4/30BS (with the colors 10 to 18).

IR-Spectroscopy: (cm$^{-1}$): 3058, 2919, 1672 (vs), 1599, 1444, 1261, 1217, 844, 756, 744 686 (vs).

The Fourier transform infrared (FTIR) spectra were recorded on a Bio-Rad Excalibur FTS 3000 spectrophotometer using a ATR reflectance method (solid samples, Golden Gate single reflection diamond attenuated total reflectance accessory). The signal peaks are given in wave numbers (cm-1). The term (vs) means very strong signal.

In an exemplary embodiment, the photoactive resin can be synthesized as follows: 98.1 g (0.5 mol) 4-acetylbiphenyl, 60.1 g (0.5 mol) acetophenone, 50 ml isopropanol and 0.35 g benzyl triethylammonium chloride are introduced to a four-necked flask and heated therein with stirring to 80° C. in an inert atmosphere. 15 ml (16.2 g; 0.2 mol) formalin (37% strength in water) are added and the mixture becomes clear after a short while. 25 g (0.25 mol) sodium hydroxide solution (40 wt. % in water) is added drop wise. The reaction mixture warms up to about 85° C. Over 30 minutes 60 ml (65 g; 0.8 mol) of formalin (37% strength in water) are added at 80-85'C. The reaction mixture is then heated to reflux for 5 h. Solvent is removed by condensation using a distilling controller dividing the reflux (three drop removed/one drop remains) up to an inner temperature of 105° C.

The obtained solid is dried in vacuum. The brittle, grayish, yellow resin in suspended in 200 ml water, stirred for 20 minutes and fritted. The washing procedure is repeated until the washed water is neutral. If necessary, remaining residues are removed by dissolving the resin in a small amount of ethyl acetate (90 ml for 100 g), filtration and re-precipitation by drop-wise addition to methanol (500 ml methanol for 100 g) resulting in a white precipitate which is fitted (D3) and feed in vacuum from volatile constituents. The photoactive resin is slightly yellowish, clear and brittle resin. According to Gas phase chromatography, the molecular weights are: Mn=1100 g/mol and Mw=1600 g/mol.

Radiation Curable Composition

According to third aspect of the present invention, a radiation curable composition is described. In one embodiment, the radiation curable compositions of the present invention exhibit low migration. Low migration characteristics are at least dependent upon the molecular weight of the components therein. Components having low molecular weights, i.e., less than 500 Daltons such as type I photoinitiators, are prone to migration as they can split into smaller molecules. Such components therefore are employed in small quantities or entirely omitted from the radiation curable compositions of the present invention to prevent migration, odor and/or contamination of products, such as foodstuffs.

In yet another embodiment, there is described a radiation curable composition exhibiting improved cure performance after being applied onto a substrate and cured with a certain UV cure dose. Improved cure performance is measured by comparing the amount of cure dose necessary for a radiation curable composition to be fully cured at similar line speeds according to standard testing protocol discussed in further detail herein. In other words, if the curable composition is capable of being cured by a smaller amount of UV cure dose (mJ/cm$^2$), a faster cure speed indirectly is realized.

In an exemplary embodiment, the radiation curable composition at least includes the above-mentioned, novel, photoactive resin in combination with an acrylate and amine. In another embodiment, the inventive photoactive resin may be used in combination with one or more conventional ketone resins. For example, the ketone resin employed may have the general structure according to Formula III below:

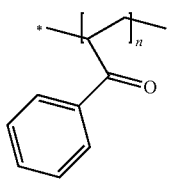

wherein n is an integer between 3 and 5, and * is selected from hydrogen or a methylol group Synthesis of the conventional ketone resin of Formula III, hereinafter referred to as Example 2, is described as follows: 60.0 g (0.5 mol) of acetophenone, 10.8 ml (0.25 mol) of methanol and 18.0 g (0.18 mol) of formaldehyde (30% strength in water) are introduced to a three-necked flask and heated therein with stirring and under a nitrogen atmosphere to 50° C. 16 g of 25% strength sodium hydroxide solution are added, and the reaction mixture was heated to 75° C. Over a period of 90 minutes, 33.0 g (0.33 mol) of formaldehyde (30% strength in water) are added and the reaction mixture is then heated to 95° C. and held under reflux for 6 h. The aqueous phase is separated from the resin phase and the resin is washed to neutrality with boiling water at dried in vacuum at 150° C. from volatile materials.

The conventional ketone resin gives a yellowish, clear and brittle resin. It is characterized as having a number average weight (Mn) of 720, a mass average weight (Mw) of 1090, a glass transition temperature (Tg)=39° C., a Gardner color of 4, and an IR-spectroscopy: n (cm$^{-1}$): 3059, 2929, 1672 (vs), 1593, 1444, 1261, 1217, 756, and 686 (vs).

In another exemplary embodiment, the radiation curable compositions include a monofunctional acrylate. In an alternative embodiment, the acrylates are multi-functional. A list of multi-functional acrylates includes, but is not limited to, ethylene glycol diacrylate, 1,4-butandiol diacrylate, 1,6-hexandiol diacrylate, dipropylene glycol diacrylate, neopentylglycol diacrylate, ethoxylated neopentylglycol diacrylates, propoxylated neopentylglycol diacrylates, tripropylene glycol diacrylate, bisphenol-A diacrylate, ethoxylated bisphenol-A-diacrylates, bisphenol-A-diglycidylether diacrylate, ethoxylated bisphenol-A-diacrylates, poly(ethylene)glycol diacrylates, trimethylolpropane triacrylate, trimethylolpropane trimethacrylate, ethoxylated trimethylolpropane triacrylates, propoxylated trimethylolpropane triacrylates, propoxylated glycerol triacrylates, pentaerythritol triacrylate, ethoxylated pentaerythritol triacrylates, propoxylated pentaerythritol tetraacrylates, ethoxylated pentaerythritol tetraacrylates, ditrimethylolpropane tetraacrylate dipentaerythritol pentaacrylate, dipentaerythritol hexaacrylate or mixtures thereof, preferred are ethoxylated trimethylolpropane triacrylates, ethoxylated pentaerythritol triacrylates and propoxylated pentaerythritol tetraacrylates, oligomeric and polymeric acrylates applied in the art, such as for example epoxy acrylates, polyester acrylates, acrylated polyurethanes, acrylated polyacrylates, acrylated polyethers, acrylated epoxidized oils based on linseed oil and soybean oil and mixtures thereof.

According to another embodiment, the radiation curable composition includes an amine. In an exemplary embodiment, the amine is a tertiary amine. One example of the tertiary amine is provided below as Formula II.

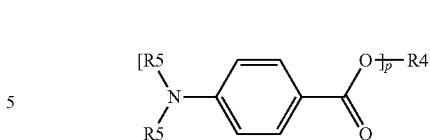

Formula II wherein
R4 is selected from mono-, di-, tri-, tetra-, peta-, hexa- or polyvalent alkyl radicals having 1 to 50 carbon atoms and which can contain ethoxylated (CH2-CH2-O) moieties,
R5 is selected from a linear, branched radical having 1 to 12 carbon atoms and can be substituted with oxygen, nitrogen or sulfur; a linear, unbranched radical having 1 to 12 carbon atoms and can be substituted with oxygen, nitrogen or sulfur; and a cyclic radical having 1 to 12 carbon atoms and can be substituted with oxygen nitrogen or sulfur, and p is an integer 1-50.

The compounds of the general Formula II are partly commercially available. Examples of such compounds include but not limited to said amine is selected from N,N-dimethyl-4-aminobenzoic acid methylester, N,N-dimethyl-4-aminobenzoic acid ethylester, N,N-dimethyl-4-aminobenzoic acid amylester, N,N-dimethyl-4-aminobenzoic acid ethylhexylester and mixtures thereof.

For low applications, oligomeric aminobenzoates of general formula 2 are preferred, these oligomeric amino benzoates are prepared for example via trans-esterification of polyols with N,N-dialkylaminobenzoic acid alkyl esters in presence of a trans-esterification catalyst at 25-200° C. One example of this reaction is shown below as:

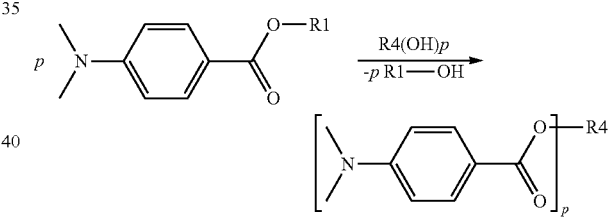

A non-limiting list of suitable polyols are ethylene glycol, diethylene glycol, triethylene glycol, dipropylane glycols, tripropylene glycols, 1,4-butandiol, 1,6-hexanediol dipropylene glycol, neopentylglycol, ethoxylated neopentylglycol propoxylated neopentylglycol tripropylene glycol, bisphenol-A ethoxylated bisphenol-A, trimethylolpropane trimethylolpropane ethoxylated trimethylolpropane propoxylated trimethylolpropane propoxylated glycerol, pentaerythritol ethoxylated pentaerythritol, propoxylated pentaerythritol, ditrimethylolpropane, dipentaerythritol, poly(ethylene)glycols, polytetrahydrofurane, and mixtures thereof.

As trans-esterification catalysts, the typical catalysts known in the art are suitable, such as acids, bases, tin organic compounds, titanium and zirconium compounds are preferred such as dibutyl tin oxide and tetrabutyl titanate, according to one embodiment, the polyols are used in excess (5-50 mol %) and during the reaction, the formed low molecular alcohol is removed by distillation in order to drive the reaction towards completion. Once the N,N-dialkylaminobenzoic acid alkyl esters are completely consumed, the reaction is finished and the products usually can be applied without further purification.

In an exemplary embodiment, synthesis of a compound of the general formula II, hereinafter referred to as Example 3, is described below. Specifically, 55.0 g of N,N-dimethylaminobenzoic acid ethylester (EDB) and 45.0 g of EO-TMP (Mw average ~450) was charged into a 250 ml flask, equipped with thermometer, mechanical stirrer, nitrogen inlet tube, condenser and receiver. Nitrogen was introduced at a rate of three bubbles/sec. Then, the mixture was heated to 60° C. so the EDB gets completely into solution. Then 1.5 g of titanium iso-propylate (Tyzor TPT) was added, and the mixture was heated to 150-170° C. and ethanol is distilled off. After the ethanol formation subsided, the reaction was resumed for another 3-5 hours @ 170° C. to minimize the residual amount of EDB. Yield: 87.8 g.

The compound according to general formula II can be characterized as having a viscosity of 15.1 Pas @ 25° C. Viscosity was determined with a Physika 300 cone and plate rheometer from Anton Parr GmbH at a shear rate of D=2-100 l/s. The viscosity value at D=50 l/s was recorded. The Gardner color was 4. The molecular weights are: Mn=950, and Mw=1120.

In an exemplary embodiment, the ratio of biphenyl ketone groups to amine groups ranges from 100:1 and 1:10. Specifically, the ratio of biphenyl ketone groups to amine groups is 100 to: 1; 2; 3; 4; 5; 6; 7; 8; 9; 10; 11; 12; 13; 14; 15; 16; 17; 18; 19; 20; 21; 22; 23; 24; 25; 26; 27; 28; 29; 30; 31; 32; 33; 34; 35; 36; 37; 38; 39; 40; 41; 42; 43; 44; 45; 46; 47; 48; 49; 50; 51; 52; 53; 54; 55; 56; 57; 58; 59; 60; 61; 62; 63; 64; 65; 66; 67; 68; 69; 70; 71; 72; 73; 74; 75; 76; 77; 78; 79; 80; 81; 82; 83; 84; 85; 86; 87; 88; 89; 90; 91; 92; 93; 94; 95; 96; 97; 98; and 99, and 1 to: 1; 2; 3; 4; 5; 6; 7; 8; 9; and 10.

In a more preferred embodiment, the ratio of biphenyl ketone groups to amine groups ranges from 50 to: 1; 2; 3; 4; 5; 6; 7; 8; 9; 10; 11; 12; 13; 14; 15; 16; 17; 18; 19; 20; 21; 22; 23; 24; 25; 26; 27; 28; 29; 30; 31; 32; 33; 34; 35; 36; 37; 38; 39; 40; 41; 42; 43; 44; 45; 46; 47; 48; 49, and 50, and 1 to: 1; 2; 3; 4; and 5.

In yet even another exemplary embodiment, the ratio of biphenyl ketone groups to amine groups ranges from 5: 1; 2; 3; 4; and 5, and 1: to 1; and 2.

According to another embodiment, the weight ratio of acrylates in the radiation curable composition to the sum of the photoactive resins and amines ranges between 50:1 to 1:10. In other words the ratio of acrylates to the sum of the photoactive resin and amine is 50 to: 1; 2; 3; 4; 5; 6; 7; 8; 9; 10; 11; 12; 13; 14; 15; 16; 17; 18; 19; 20; 21; 22; 23; 24; 25; 26; 27; 28; 29; 30; 31; 32; 33; 34; 35; 36; 37; 38; 39; 40; 41; 42; 43; 44; 45; 46; 47; 48; 49, and 50, and 1 to: 1; 2; 3; 4; 5; 6; 7; 8; 9 and 10.

In an exemplary embodiment the weight ratio of acrylates in the radiation curable composition to the sum of the photoactive resin and amines ranges between 25 to: 1; 2; 3; 4; 5; 6; 7; 8; 9; 10; 11; 12; 13; 14; 15; 16; 17; 18; 19; 20; 21; 22; 23; 24; and 25, and 1 to: 1; 2; 3; 4; and 5. In yet even a further, exemplary embodiment, the weight ratio of acrylates in the radiation curable composition to the sum of the photoactive resin and amines ranges between 5 to: 1; 2; 3; 4; 5, and 1 to: 1; and 2.

According to a fourth aspect of the present invention, the synthesis of the radiation curable composition is described. In an exemplary embodiment, the curable compositions of the present invention are made by dissolving, mixing or blending an acrylate, a photoactive resin of the general formula 1 and a tertiary amine of the general Formula II at about 25-125° C. The components may be degassed with air, if elevated temperatures are used to dissolve the photoactive resin and tertiary amine in the acrylates. The addition of a polymerization inhibitor preferably at about 0.05-2 weight % can also be helpful to avoid a premature polymerization of the acrylates when dissolving at temperatures >60° C.

According to a yet a further exemplary embodiment for synthesizing the radiation curable composition, 680 ml of ethoxylated trimethylol propane triacrylate (Ebecryl TMPOTA, product of Cytec company U.S.A.) was dissolved with 10.0 g of polymerization inhibitor Genorad 18 (product of Rahn-group, Switzerland) and stirred at room temperature. The solution was sparged with air and heated to 80° C. 250.0 g of powdered compound of the photoactive resin of Formula I described above was added in equal portions over 1 hour. The mixture was stirred for another three hours at 80° C. 70. Og of the tertiary amine of Formula II described above was added, filtered hot through a 150 μm brass sieve, and canned.

The curable composition is a yellow liquid having a Gardner color of 3-4 and a viscosity of 845 mPas @ 25° C. (shear rate D=50 l/s). Viscosity was determined with a Physika 300 rheometer from Anton Parr GmbH.

Radiation Curable Ink

According to a fifth aspect of the present invention, there is described a radiation curable ink. The radiation curable ink includes a radiation curable composition, i.e., varnish, colorant and additives. The varnish was described above in detail as the radiation curable composition.

In one embodiment, the radiation curable ink, includes a photoactive resin as described above. The resin is present in an amount less than or equal to 30 wt. %; 29 wt. %; 28 wt. %; 27 wt. %; 26 wt. %; 25 wt %; 24 wt %; 23 wt %; 22 wt %; 21 wt %; 20 wt %; 19 wt %; 18 wt %; 17 wt %; 16 wt %; 15 wt %; 14 wt %; 13 wt %; 12 wt %; 11 wt %; 10 wt %; 9 wt %; 8 wt %; 7 wt %; 6 wt %; 5 wt %; 4 wt %; 3 wt %; 2 wt %; and 1 wt % of the radiation curable ink.

In another embodiment, the radiation curable ink include a mixture of ketone resins with at least one being the novel, photoactive resin. In yet another embodiment, the radiation curable ink includes a mixture of the novel, photoactive resin in combination with a standard ketone resin according to Formula III as disclosed above. In an exemplary embodiment, the mixture ranges from 30:70 to 70:30; 40:70 to 70:30; 50:70 to 70:30; 60:70 to 70:30. In another exemplary embodiment, the mixture ranges from 30:70 to 60:40; 30:70 to 50:50; 30:70 to 40:60. In yet another exemplary embodiment, the mixture is about 50:50.

According to another embodiment, the radiation curable ink includes one or more acrylates as described above. In an exemplary embodiment, the acrylate is a multifunctional acrylate monomer or acrylate oligomer or mixtures thereof. The total amount of acrylate in the radiation curable ink is less than or equal to about 60 wt %; 59 wt %; 58 wt %; 57 wt %; 56 wt %; 55 wt %; 54 wt %; 53 wt %; 52 wt %; 51 wt %; 50 wt %; 49 wt %; 48 wt %; 47 wt %; 46 wt %; 45 wt %; 44 wt %; 43 wt %; 42 wt %; 41 wt %; 40 wt %; 39 wt %; 38 wt %; 37 wt %; 36 wt %; 35 wt %; 34 wt %; 33 wt %; 32 wt %; 31 wt %; 30 wt %; 29 wt %; 28 wt %; 27 wt %; 26 wt %; 25 wt %; 24 wt %; 23 wt %; 22 wt %; 21 wt %; 20 wt %; 19 wt %; 18 wt %; 17 wt %; 16 wt %; 15 wt %; 14 wt %; 13 wt %; 12 wt %; 11 wt %; 10 wt %; 9 wt %; 8 wt %; 7 wt %; 6 wt %; 5 wt %; 4 wt %; 3 wt %; 2 wt %; and 1 wt %.

According to another embodiment, the radiation curable ink includes one or more amines as described above. In an exemplary embodiment, the amine is a tertiary amine. The total amount of amine in the radiation curable ink is less than or equal to about 20 wt %; 19 wt %; 18 wt %; 17 wt %; 16 wt %; 15 wt %; 14 wt %; 13 wt %; 12 wt %; 11 wt %; 10 wt %; 9 wt %; 8 wt %; 7 wt %; 6 wt %; 5 wt %; 4 wt %; 3 wt %; 2 wt %; and 1 wt %.

The radiation curable inks may also include a colorant. The colorant may be a pigment or a dye. The colorants may be organic or inorganic. The dyes include, but are not limited to azo dyes, anthraquinone dyes, xanthene dyes, azine dyes, combinations thereof and the like.

Organic pigments may be one pigment or a combination of pigments, such as for instance Pigment Yellow Numbers 12, 13, 14, 17, 74, 83, 114, 126, 127, 174, 188; Pigment Red Numbers 2, 22, 23, 48:1, 48:2, 52, 52:1, 53, 57:1, 112, 122, 166, 170, 184, 188, 202, 266, 269; Pigment Orange Numbers 5, 16, 34, 36; Pigment Blue Numbers 15, 15:3, 15:4; Pigment Violet Numbers 3, 23, 27; and/or Pigment Green Number 7.

The pigment may also be Pigment Black 7 (carbon black) or other inorganic pigments, such as Pigment White 6 (Titanium Dioxide), Pigment Black 11 (Black Iron Oxide), Pigment Red 101 (Red Iron Oxide) and Pigment Yellow 42 (Yellow Iron Oxide). Among those pigments suitable for use in the present invention are conventional organic pigments such as: Pigment Yellow 1, Pigment Yellow 3, Pigment Yellow 12, Pigment Yellow 13, Pigment Yellow 14, Pigment Yellow 17, Pigment Yellow 37, Pigment Yellow 63, Pigment Yellow 65, Pigment Yellow 73, Pigment Yellow 74, Pigment Yellow 75, Pigment Yellow 83, Pigment Yellow 97, Pigment Yellow 98, Pigment Yellow 106, Pigment Yellow 114, Pigment Yellow 121, Pigment 26 Yellow 126, Pigment Yellow 136, Pigment Yellow 174, Pigment Yellow 176, Pigment Yellow 188, Pigment Orange 5, Pigment Orange 13, Pigment Orange 16, Pigment Orange 34, Pigment Red 2, Pigment Red 9, Pigment Red 14, Pigment Red 17, Pigment Red 22, Pigment Red 23, Pigment Red 37, Pigment Red 38, Pigment Red 41, Pigment Red 42, Pigment Red 112, Pigment Red 146, Pigment Red 170, Pigment Red 188, Pigment Red 196, Pigment Red 210, Pigment Red 238, Pigment Blue 15, Pigment Blue 15:1, Pigment Blue 15:2, Pigment Blue 15:3, Pigment Blue 15:4, Pigment Green 7, Pigment Green 36, Pigment Violet 23, or carbon black, including Pigment Black 7 and the like.

Inorganic pigments may include but not limited to iron oxides, titanium dioxides, chromium oxides, ferric ammonium ferrocyanides, ferric oxide blacks, Pigment Black Number 7 and or Pigment White Numbers 6 and 7. Other organic and inorganic pigments and dyes can also be employed, as well as combinations that achieve the colors desired.

The colorant may be present in the energy curable lithographic ink in an amount less than 25 wt %; 24 wt %; 23 wt %; 22 wt %; 21 wt %; 20 wt %; 19 wt %; 18 wt %; 17 wt %; 16 wt %; 15 wt %; 14 wt %; 13 wt %; 12 wt %; 11 wt %; 10 wt %; 9 wt %; 8 wt %; 7 wt %; 6 wt %; 5 wt %; 4 wt %; 3 wt %; 2 wt %; and 1 wt %.

According to another embodiment, the radiation curable ink may further include one or more photoinitiators. According to yet another embodiment, the energy curable lithographic ink includes a photoinitiator. The photoinitiators induce a reaction such as cross-linking reaction or polymerization by irradiation with light to increase the molecular weight of the prepolymer. In such a case, when the photoinitiator may, for example, be a benzoine alkyl ether derivative, a benzophenone derivative, an a-aminoalkylphenone type, an oxime ester derivative, a thioxanthone derivative, an anthraquinone derivative, an acylphosphineox-50 ide derivative, a glyoxyester derivative, an organic peroxide type, a trihalomethyltriazine derivative or a titanocene derivative. Specifically, IRGACURE 651, IRGACURE 184, DAROCUR 1173, IRGACURE 500, IRGACURE 2959, IRGACURE 754, IRGACURE 907, IRGACURE 369, IRGACURE 1300, IRGACURE 819, IRGACURE 819DW, IRGACURE 1880, IRGACURE 1870, DAROCUR TPO, DAROCUR 4265, IRGACURE 784, IRGACURE OXEO1, IRGACURE OXE02 or IRGACURE 250 (manufactured by 60 Ciba Specialty Chemicals K.K.), KAYACURE DETX-S, KAYACURE CTX, KAYACURE BMS or KAYACURE 2-EAQ (manufactured by Nippon Kayaku Co., Ltd.), TAZ101, TAZ-102, TAZ-103, TAZ-104, TAZ-106, TAZ-107, TAZ-108, TAZ-110, TAZ-113, TAZ-114, TAZ-118, TAZ-65 122, TAZ-123, TAZ-140 or TAZ-204 (manufactured by Midori Kagaku Co., Ltd.) may, for example, be mentioned.

The photoinitiator may be used alone or in combination as a mixture of two, or more photoinitiators. A high sensitive initiator is desired since it is possible to carry out curing by a low irradiation energy. IRGACURE 907 (alpha-aminoalkylphenone type), IRGACURE 369 (alpha-a-aminoalkylphenone type), DAROCUR TPO (acylphosphineoxide type), IRGACURE OXE01 (oxime ester derivative) or IRGACURE OXE02 (oxime ester derivative) is preferred, and DAROCUR TPO, IRGACURE OXE01 or IRGACURE OXE02 is particularly preferred.

The photoinitiator may be present in the radiation curable lithographic ink in an amount less than about 15 wt. %; 14 wt. %; 13 wt. %; 12 wt. %, 11 wt. %, 10 wt. %; 9 wt. %, 8 wt. %; 7 wt. %; 6 wt. %; 5 wt %; 4 wt %; 3 wt %; 2 wt % and 1 wt %, 0.9 wt. %; 0.8 wt. %; 0.7 wt. %; 0.6 wt. %; 0.5 wt %; 0.4 wt %; 0.3 wt %; 0.2 wt %; and 0.1 wt %.

According to yet another embodiment of the radiation curable ink, the ink composition may essentially be free of photoinitiators. In an exemplary embodiment, the photoinitiators may be present in small amounts, preferably less than 1.5 weight %, more preferably less than 1 weight %. These photoinitiators are of a low molecular weight of less than about 500 Daltons, such as for example benzophenones, benzilketales, dialkoxy acetophenones, hydroxyalkylacetophenones, aminoalkylphenones, acylphosphinoxides and thioxanthones, for example benzophenone, methylbenzophenone, 4-phenylbenzophenone, 4,4'-bis(dimethylamino)-benzophenone, 4,4'-bis(diethylamino)-benzophenone, 2,2-dimethoxy-2-phenylacetophenone, dimethoxyacetophenone, diethoxyacetophenone, 2-hydroxy-2-methyl-1-phenylpropan-1-one, 2-benzyl-2-dimethylamino-1-(4-morpholinophenyl)-butan-1-one, 2-methyl-1-[4(methoxythio)-phenyl]-2-morpholinopropan-2-one, diphenylacylphenyl phosphinoxide, diphenyl(2,4,6-trimethylbenzoyl)phosphinoxide, 2,4,6-trimethylbenzoylethoxyphenyl phosphinoxide, 2-isopropylthioxantone, 4-isopropylthioxanthone, 2,4-dimethylthioxanthone.

According to yet another exemplary embodiment of the invention, the radiation curable ink may contain usual additives to modify flow, surface tension, gloss and abrasion resistance of the cured coating or printed ink. Such additives contained in inks or coatings typically are a surface-active agent, a wax, or a combination thereof. These additives may function as leveling agents, wetting agents, slip agents, anti misting agents, dispersants and de-aerators. Preferred additives include fluorocarbon surfactants, silicones and organic polymer surfactants and inorganic materials such as talc. Generally, the amount of additives is less than about 10 wt. %; 9 wt. %; 8 wt. %; 7 wt. %; 6 wt. %; 5 wt %; 4 wt %; 3 wt %; 2 wt %; and 1 wt %. of the radiation curable ink.

According to an exemplary embodiment, the energy curable lithographic inks include a wax. The wax may include but is not limited to parrafinic wax, carnauba wax, mineral waxes, montan wax and its derivatives, petroleum wax, and synthetic waxes such as polyethylene and oxidized polyethylene waxes. In an exemplary embodiment, the wax may be present in the energy curable lithographic ink in an amount less than 5 wt %; 4 wt %; 3 wt %; 2 wt %; 1 wt %, 0.9 wt. %; 0.8 wt. %; 0.7 wt. %, 0.6 wt. %; 0.5 wt %; 0.4 wt %; 0.3 wt %; 0.2 wt %; and 0.1 wt %.

According to an exemplary embodiment, the radical polymerization inhibitor includes but is not limited to hydroquinone, benzoquinone, p-methoxyphenol or TEMPO. Without being restricted to these compounds, such inhibitors include compounds with quinone or hydroquinone units, in particular benzoquinone and substituted benzoquinones, hydroquinone and substituted hydroquinones, such as 2,6-dimethylhydroquinone; ethers of hydroquinones, in particular of hydroquinones and substituted hydroquinones such as hydroquinone monomethylether (4-methoxphenol), t-butylhydroquinone (4-t-Butylphenol, TBHQ), and t-butylhydroxyanisol (BHA); resorcinol; pyrogallol; phosphite esters; and sterically hindered phenols and bisphenols, such as 2,6-di-t-butyl-4-methylphenol (BHT), 2,6-di-t-butyl-4methoxyphenol and 2,4,6-tri-t-butylphenol; stable free radicals such as di-t-butylnitroxide and 2,2,6,6-tetramethyl-4pyridonenitroxide; nitro-substituted aromatics; phenothiazine and secondary diarylamines, such as substituted diphenylamines, N,N'-diphenyl-p-phenylenediamine and N-phenylnaphthylamine metal complexes or salts such as bis(dibutyl dithiocarbamato)copper and aluminum N-nitroso phenylhydroxylamine. Quinones, hydroquinones, ethers of hydroquinones and sterically hindered phenols are preferred free radical inhibitors. More preferred are ethers of hydroquinones, in particular ethers of hydroquinone and sterically hindered phenols. Hydroquinone monomethylether (4-methoxphenol), 2,6-di-t-butyl-4-methylphenol, 2,4,6-tri-t-butylphenol bis(dibutyl dithiocarbamato)copper and aluminum N-nitroso phenylhydroxylamine are preferred compounds.

As additional components of compositions of the present invention, one or more other ingredients may be incorporated into compositions of the present invention in accordance with conventional practices. These optional additives include one or more additional solvents; gloss modifiers; slip modifiers; antifoaming agents; flow or other rheology control agents; oils; plasticizers; binders; antioxidants; stabilizers; fungicides; bactericides; organic and/or inorganic filler particles; leveling agents; opacifiers; antistatic agents; dispersants; and the like.

According to a sixth aspect of the invention there is described the synthesis of the radiation curable ink. Due to the high reactivity of the radiation curable compositions of the present invention, they are especially suitable for radiation curable printing inks, such as for example a UV-flexo ink, a UV-jet ink, a UV-gravure ink or a UV-offset ink. Pigments and dyes usually absorb light, which is required to form radicals for the polymerization, so that highly reactive radiation curable compositions are preferred for inks. The inks are usually made by grinding a dry pigment into it or by flushing the pigment press-cake into it. For low migration inks, dry grind is preferred as abrasion material from the mill beads may contaminate the ink. In a typical manufacturing procedure for inks, the required amount of dry pigment is mixed with a solution of the ketone resin of this invention in an acrylate on a mixer for 15-30 minutes to wet out all pigment. The dispersed pigment is then ground on a three roll mill until the desired grind specifications are met. The letdown vehicle containing monomer, oligomer, and additive(s), e.g., wax, talc etc., is then added to this mill base and passed over the three roll mill once or twice, until the desired particle size and color strength is achieved. The tack and viscosity of the ink is tested on a rheometer and inkometer and adjusted by adding the appropriate amounts of monomer(s) to arrive at a finished ink.

In an exemplary embodiment, 54.0 weight % of a radiation curable varnish of this invention was placed in a mixing container and mixed with 15 wt. % of pigment yellow 14 for 30 minutes. The breakdown of the radiation curable composition was 50 wt. % trimethyl propoan triacrylate, 42 wt. % of photoactive resin of Formula I and 8 wt. % of tertiary amine Formula II. The other additives and monomers were added and stirred in for 15 minutes. The mixture was passed over a three roll mill, one pass at 5 bar and two passes at 15 bar. The ink exhibited a viscosity of 42 1 Pas at 25° C. (D=50 l/s) measured as previously described using a Physika 300 rheometer, a shortness ratio of 4.8 (viscosity at D=2.5 l/s divided by viscosity at D=100 l/s) and a tack of 16 INKO on the Prüfbau Ink-o-mat at 300 rpm. The composition is provided in detail in Table 1 below.

TABLE 1

| Material | Weight % |
|---|---|
| Radiation curable composition of the present invention (based on 50 wt. % TMPTA, 42% of compound of Example 1 and 8 wt. % of compound of Example 3) | 54.0 |
| Trimethylol propane triacrylate | 10.0 |
| Polyester acrylate based on pentaerythritol | 15.0 |
| Pigment yellow 14 | 15.0 |
| Phenolic polymerization inhibitor | 0.5 |
| Inorganic flow additive | 5.5 |
| Total | 100.00 |

According to another exemplary embodiment, there is described an offset ink formulation prepared by the dry grind method. The formulation exhibited a viscosity of 20-50 Pas at 25° C. (D=50 l/s). The ink formulation includes the components listed in Table 2.

TABLE 2

| Material | Weight % |
|---|---|
| Radiation curable composition of the present invention* | 20-60 |
| Tri- and tetra-functional acrylated monomers | 5-30 |
| Acrylated polyester oligomer | 0-20 |
| Additives (misting reducing agent, wax, extenders, polymerization inhibitors) | 2-10 |
| Pigments | 10-25 |
| Total | 100.0 |

*mixture within the preferred ratio of acrylate, resin and amine as mentioned herein and having a viscosity range of 10-40 Pas.

According to another exemplary embodiment, there is described an UV-flexographic ink formulation, prepared from a mill base. The formulation exhibited a viscosity of 0.5-2 Pas at 25° C. (D=50 l/s). The formulation includes the components listed in Table 3 below.

TABLE 3

| Material | Weight % |
|---|---|
| Radiation curable composition of the present invention* | 20-30 |
| Di, tri- and tetra-functional acrylated monomers | 30-60 |
| Acrylated polyester oligomers | 5-10 |

TABLE 3-continued

| Material | Weight % |
| --- | --- |
| Additives (wetting agents, slip agents, antifoam agents) | 2-10 |
| Pigments | 12-20 |
| Total | 100.0 |

*mixture within the preferred ratio of acrylate, resin and amine as mentioned herein and having a viscosity range of 10-40 Pas.

According to another exemplary embodiment, there is described an UV-screen ink formulation prepared from a three roll mill. The formulation exhibited a viscosity of 15-30 Pas at 25° C. (D=50 l/s). The formulation includes the components listed in Table 4 below.

TABLE 4

| Material | Weight % |
| --- | --- |
| Radiation curable composition of the present invention* | 20-50 |
| Acrylated di- and tri-functional monomers | 5-30 |
| Acrylated epoxy oligomers | 0-20 |
| N-vinylcaprocactame | 5-20 |
| Additives (silicones antifoam agent, wax) | 2-7 |
| Pigments | 5-10 |
| Total | 100.0 |

*mixture within the preferred ratio of acrylate, resin and amine as mentioned herein and having a viscosity range of 10-40 Pas.

Printed Article

According to a seventh aspect of the invention, there is described a printed article including the inventive radiation curable composition or ink applied onto a substrate. The radiation curable composition or ink is cured with a source of energy such as UV radiation. The substrate to be printed on may be composed of any typical substrate material such as cellulosic materials such as paper or cardboard, plastics, metals, and composites. The substrate may be a print stock typically used for publications or may be a packaging material in the form of a sheet, a container such as a bottle or can, or the like. In most instances, the packaging material is a polyolefin such as a polyethylene or a polypropylene, a polyester such as polyethylene terephthalate, or a metal such as an aluminum foil, a metalized polyester, or a metal container. It is understood that in cold foil laminations, the substrate can be different from metal foil. Namely, the substrate and metal foil have dissimilar surface properties. The packing material may be used to contain any kind of liquid or solid material such as foods, drinks, cosmetics, biological materials or specimens, pharmaceuticals, etc.

Results and Discussion

For purposes of analytical testing, the radiation curable compositions and inks of the present invention were coated onto cardboard substrates with a 12 μm wire applicator and UV-cured with decreasing UV-doses ranging from about 500 to about 100 mJ/cm.

In one test, the radiation curable compositions were visually tested based on a cure rating of Good, Fair, Poor and Insufficient/Uncured. Good cure is defined as the surface being dry and non-tacky. Fair cure is defined as the surface being dry yet retaining marks or fingerprints. Poor cure is defined by a greasy and tacky surface. Insufficient/Uncured is defined by the surface remaining wet.

Another test employed in this application is the "Thumb Twist" test. The thumb twist test can be employed for dry radiation curable compositions, i.e., varnishes, and also radiation curable inks. Specifically, an opposite surface of a substrate with a cured ink layer on one surface is placed on a hard surface. Then, one thumb is pressed on the substrate, and rotated about 90 degrees. Depending on the amount of ink transferred to the thumb and the appearance of the ink surface, the curing of the ink is rated from (Excellent 1 ⇐······⇒ 5 Poor). A rating of 1 through 3 is defined as: (i) little or none of the film being transferred onto the thumb, and (ii) the film appears visually undestructed. A rating of 4 is defined by the surface retaining marks or fingerprints. A rating of 5 is defined as an insufficient degree of curing, and the surface is greasy or tacky. The "Thumb Twist" test is further described in C Lowi, G. Webster, S. Kellse and I. McDonald's "Chemistry & Technology for UV & EB Formulation for Coatings, Inks & Paints" volume 4, p. 54, published in 1997 by John Wiley & Sons Ltd. in association with SITA Technology, Ltd., ISBN 0 947798 54 4, and in C. Lowe and R. K.

The IPA solvent resistance test is employed by rubbing the cured ink surface with a cotton cloth soaked with isopropyl alcohol. The number of double-rubs is recorded at which the ink is not affected. With our ink, the rating was as follows: Excellent 1 (>20 double rubs), 2 very good (>10 double rubs), good 3 (~5 double rubs), 4 fair (2-3 double rubs), poor (1-2 double rubs). ASTM D5402-06 further describes the procedure of this test.

In yet another embodiment, the set-off test as disclosed in US 2012/0171434 A1 at para. [0039] is employed to determine the extent of transfer of the radiation curable composition which transfers onto a reverse side of a substrate upon being subjected to 10 tons of pressure for 5 seconds. First, the ink is applied onto a surface of a cardboard substrate with an IGT print proofer (IGT 5). Directly after, the ink is UV-cured with a 200 Watt Fusion H-bulb at a line speed of 400 feet/min, the reverse surface of a paper board substrate (incada exel or silk–3×3 cm$^2$) is applied on the cured ink sample. Both are introduced on a press and a pressure of 10 tons is applied for 5 seconds. The print is released as soon as the pressure is reached. The set off material on the board substrate measured with a densitometer and compared to the standard. In an ideal case, no ink is transferred and the densitometer reading is 0 (excellent). By comparing with the competitor ink under the same curing conditions and printed density, the ink with a lower number on the densitometer cures better. The optical densities for different colored inks are as follows: 1.25-1.3 for yellow 1.4-1.45 for magenta, 1.5-1.55 for cyan and 1.75-1.80 for black.

FIG. 1 illustrates a tertiary phase diagram of the radiation curable composition. The top corner is described as Formula I, the left corner is described as acrylate, and the right corner is described as Formula II. The legend in FIG. 1 provides the required UV dose in mJ/cm2 necessary to obtain a dry and cured surface exhibiting a "Good Cure" rating as defined above.

According to Table 5 shown below, and further in reference to FIG. 1, radiation curable compositions located at points 1, 2, 4, 5, 8 and 9 exhibit "Good cure" ratings. Namely, less than about 400 mJ/cm$^2$ UV light dose is required. The radiation curable compositions at Points 3, 6 and 7 are located in areas of the phase diagram requiring greater than 400 mJ/cm$^2$ of a UV light dose to obtain "Good" cure ratings and considered less ideal for purposes of fast curing. According to the inventors, generally a ratio whereby more acrylate to the sum of Formulas I and II is desired. However, as shown by the radiation curable compositions at Point 3, when the ratio of acrylate to the sum of Formulas I and II is too low, the composition starves from acrylate curing. On the other hand, when the amount of acrylate is too high in comparison to the sum of Formulas I and II as shown in Point 6, cure results also are diminished and attributed to the amount of Formula I being too low to effectively trigger radial formation on Formula II. Therefore, despite high acrylate content, curing is suppressed.

In addition, a greater amount of Formula I to Formula II is preferred but not required. For example, the radiation curable composition located at Point 4 still exhibits "Good Cure" results at cure doses less than about 400 mJ/cm$^2$. However, when the amount of Formula I is present in significantly less quantity than Formula II, such as in the radiation curable composition located at Point 7, greater than 400 mJ/cm$^2$ UV cure dose is required.

resins designated as Component B were dissolved separately and mixed with Component C. Table 6 shows that the radiation curable composition of the present invention, containing ketone resins of the general Formula I (entry 1), exhibit superior cure compared to commercially available ketone resins (entries 2-5). This is observed by the "Good" cure rating at 500 mJ/cm 2, and "Fair" cure rating at 250 mJ/cm 2. None of the radiation curable compositions of entries 2-5 were able to cure at doses less than or equal to 500 mJ/cm. Based on this data, faster cure speed indirectly is realized for entry 1 because less cure dose is necessary to obtain a rating of "Good" cure defined as dry.

TABLE 6

| Entry | Ketone Resin (Inventive or Comparative) | TMPTA (Component A) | Ketone Resin (Component B) | Oligomeric Amino benzoate** (Component C) | UV-Cure Rating* | | |
|---|---|---|---|---|---|---|---|
| | | | | | 500 mJ/cm$^2$ | 250 mJ/cm$^2$ | 100 mJ/cm$^2$ |
| 1 | Resin 1 (Inventive) | 80.0 | 15.6 | 4.4 | Good | Fair | Insufficient |
| 2 | Resin 2 (Comparative) | 80.0 | 15.6 | 4.4 | Uncured | Uncured | Uncured |
| 3 | Resin 3 (Comparative) | 80.0 | 15.6 | 4.4 | Uncured | Uncured | Uncured |
| 4 | Resin 4 (Comparative) | 80.0 | 15.6 | 4.4 | Insufficient | Uncured | Uncured |
| 5 | Resin 5 (Comparative) | 80.0 | 15.6 | 4.4 | Uncured | Uncured | Uncured |

TMPTA = trimethylolpropane triacrylate (Sartomer SR351) (Component A)
Resin 1: Resin of Example 1 = compound of general formula 1 (Component B)
Resin 2: Cyclohexanone formaldehyde resin L2 (Leuma Harze)
Resin 3: Cyclohexanone formaldehyde resin Variplus CA (Tego)
Resin 4: Hydrogenated Cyclohexanone formaldehyde resin Variplus SK (Tego)
Resin 5: Aldehyde-ketone resin Variplus TC (Tego)
**Genopol AB-1 (product of Rahn, Switzerland) = compound of the general formula 2 (Component C)
Note:
FIGURES in all of the tables are based on weight %

TABLE 5

| Point | Formula I [g] | Acrylate [g] | Formula II [g] |
|---|---|---|---|
| 1 | 3.775 | 4.425 | 1.9 |
| 2 | 5.000 | 5.000 | 0.1 |
| 3 | 5.000 | 2.600 | 2.5 |
| 4 | 1.325 | 6.875 | 1.9 |
| 5 | 3.775 | 5.625 | 0.7 |
| 6 | 0.100 | 9.900 | 0.1 |
| 7 | 0.100 | 7.500 | 2.5 |
| 8 | 1.325 | 8.075 | 0.7 |
| 9 | 2.550 | 6.250 | 1.3 |

As shown in Table 6, the effectiveness of the inventive photoactive resin is compared with conventional ketone resins. In each example, trimethylolpropane triacrylate (Sartomer SR351), is the acrylate designated as Component A. In each example, an ologimeric amino benzoate, such as Genopol AB-1 was designated as Component C. The ketone The experiments described in Table 7 are for cure data when employing different amines (Component C) while maintaining the same acrylate and resin components. Trimethylolpropane triacrylate (Sartomer SR351) is Component A, the resin of Example 1 is Component B. Components A and B are dissolved, and mixed separately with several different amines (Component C). The radiation curable compositions were coated on cardboard with a 12 μm wire applicator and UV-cured with decreasing UV-dose from 500 to 100 mJ/cm. After UV-cure, the cured coating was rated depending on the condition of the surface, as explained above. Table 7 dearly shows that the radiation curable compositions of this invention, containing an amine of the general formula II (entries 1 and 6), exhibit superior cure compared to radiation curable compositions containing other amines (entries 3, 4, 5 and 7). Namely, entries 3, 4, 5 and 7 cannot cure at cure doses less than or equal to 500 mJ/cm.

TABLE 7

| Entry | Amine # (Inventive or Comparative) | TMPTA (Component A) | Example I Ketone Resin (Component B) | Amine (Component C) | UV-Cure Rating* | | |
|---|---|---|---|---|---|---|---|
| | | | | | 500 mJ/cm$^2$ | 250 mJ/cm$^2$ | 100 mJ/cm$^2$ |
| 1 | Amine 1 (Inventive) | 80.0 | 15.6 | 4.4 | Good | Good | Fair |

TABLE 7-continued

| Entry | Amine # (Inventive or Comparative) | TMPTA (Component A) | Example I Ketone Resin (Component B) | Amine (Component C) | UV-Cure Rating* 500 mJ/cm² | 250 mJ/cm² | 100 mJ/cm² |
|---|---|---|---|---|---|---|---|
| 2 | None (Comparative) | 80.0 | 15.6 | — | Uncured | Uncured | Uncured |
| 3 | Amine 2 (Comparalive) | 80.0 | 15.6 | 4.4 | Uncured | Uncured | Uncured |
| 4 | Amine 3 (Comparative) | 80.0 | 15.6 | 4.4 | Uncured | Uncured | Uncured |
| 5 | Amine 4 (Comparative) | 80.0 | 15.6 | 4.4 | Uncured | Uncured | Uncured |
| 6 | Example 3 (Inventive) | 80.0 | 15.6 | 4.4 | Good | Good | Fair |
|   | Amine 5 (Comparative) | 80.0 | 15.6 | 4.4 | Poor | Uncured | Uncured |
|   | Amine 1 (Comparative) | 80.1 | — | 4.4 | Uncured | Uncured | Uncured |

TMPTA = trimethylolpropane triacrylate (Sartomer SR351) (Component A)
Amine of Example 3: oligomeric aminobenzoate
Amine 1: N,N-dimethyl-4-aminobenzoic acid ethylester
Amine 2: Aliphatic amino acrylate (adduct of TPGDA/morpholine)
Amine 3: Aliphatic amino acrylate (adduct of morpholine to Di-TMPTA)
Amine 4: N-methyldiethanolamine
Amine 5: Tributylamine For the experiments of Table 8, in trimethylolpropane triacrylate (Sartomer SR351), which represents Component A, different aromatic ketone resins (Component B) were dissolved, and mixed with an oligomeric aromatic amine (Component C). The radiation curable compositions were coated on cardboard with a 12 μm wire applicator and UV-cured with decreasing UV-dose from 250 to 165 mJ/cm". After UV-cure, the cured coating was rated depending on the condition of the surface, as explained above.

TABLE 8

| Entry | TMPTA (Component A) | Ketone Resin (Component B) | Type and structure of Ketone | Amine** (Component C) | UV-Cure Rating* 250 mJ/cm² | 165 mJ/cm² |
|---|---|---|---|---|---|---|
| 1 (Inventive) | 80.3 | 15.6 | Resin of Example 1 | 4.1 | Good | Good-fair |
| 2 (Comparative) | 80.3 | 15.6 | Resin of Example 2 | 4.1 | Fair | Poor |
| 3 (Comparative) | 80.0 | 15.6 | Variplus AP | 4.1 | Fair | Poor |

TMPTA = trimethylolpropane triacrylate (Sartomer SR351)
Variplus AP: Commercial ketone resin Variplus AP from Evonik (Tego) company
**Genopol AB-1 (product of Rahn, Switzerland) = compound of the general formula 2 (Component C)

Table 8 indicates that the radiation curable compositions of the present invention, containing a ketone of the general formula 1 (entry 1), exhibit superior cure compared to radiation curable compositions containing other aromatic ketone resins (entry 2 and 3)

According to Table 9 shown below, the enhanced reactivity of an offset ink with about 10 wt. % of the inventive modified ketone resin was employed in a press trial on a Didde lithographic printing press equipped with a UV dryer. A Sun Chemical standard low migration cyan process ink is compared with an inventive low migration ink. The inventive ink exhibits better cure with the same amount of photoinitiators. In this test, about 1.2 wt. % Type I photoinitiators and 5.2 wt. % Type II photoinitiators are employed. Upon curing with a 200 Watt bulb at 400 feet/minute, the inventive inks exhibit better solvent resistance based upon the thumb twist test and IPA solvent test, less feedback at high printing speed, and less piling at high printing speed.

TABLE 9

| | Standard low migration cyan ink [wt. %] | Inventive low migration cyan ink [wt. %] |
|---|---|---|
| Formulations: | | |
| Multifunctional acrylic monomers | 32.8 | 34.0 |
| Acrylated epoxidized oil | 8.5 | 8.4 |
| Photo initiator blend: non-splitting Type-II | 5.2 | 5.2 |
| Photo initiator blend: splitting Type-I | 1.2 | 1.2 |
| Polymeric aminobenzoate (Formula II) | 3.6 | 3.6 |
| Additives | 5.0 | 4.9 |
| Phthalocyanine cyan pigment | 22.5 | 22.5 |
| Modified ketone resin (Formula I) | — | 9.8 |
| Conventional ketone resin (Formula III) | 21.2 | 10.4 |
| Properties: | | |
| Tack after 1 min. @ 1200 rpm | 18.6 | 16.8 |
| Tack after 2 min. @ 1200 rpm | 17.9 | 16.2 |
| Misting (Excellent 1<-->5 Poor) | 3 | 3.1 |
| Viscosity (Pas@25° C., D = 0.1 1/s) | 827.7 | 957.3 |
| Viscosity (Pas@25° C., D = 100 1/s) | 11.1 | 8.58 |
| Viscosity emulsified (Pas@25° C., D = 0.1 1/s) | 653.7 | 940.1 |
| Viscosity emulsified (Pas@25° C., D = 100 1/s) | 5.8 | 5.6 |
| Feed-back @ 400 feet per minute | No | No |
| Feed-back @ 800 feet per minute | Little | No |
| Piling on blanket and blate @ 800 feet/minute | Some | Minimal |
| Piling on chiller roller with 200 W @ 400 feet/minute | Yes | No |
| Piling on chiller roller with 400 W @ 400 feet/minute | No | No |
| Water window | 28-48 | 26-46 |
| UV-cure with 200 Watt bulb @ 400 feet/minute Thumb twist test. Rating: (Excellent 1<-->5 Poor) | 4 | 3 |
| UV-cure with 200 Watt bulb @ 400 feet/minute IPA solvent resistance. Rating: (Excellent 1<-->5 Poor) | 4 | 3 |
| Set-off test with 67 mJ/cm² (Optical Density 1.7) | <0.1 | <0.1 |

Lab evaluation of a black inventive low migration ink versus a Sun Chemical standard low migration black ink in Table 10 below. The inventive ink shows the same level of cure but without having splitting type-I photoinitiators. Residual splitting type-I photo initiators and their splitting products are commonly regarded as a main source of migration. These component cause odor and bad taste of foodstuff products enclosed in a packaging substrate. As such, the inventive inks exhibit improved migration characteristics.

TABLE 10

| | Standard low migration black ink [wt. %] | Inventive low migration black ink [wt. %] |
|---|---|---|
| Formulation: | | |
| Acrylic monomers | 29.3 | 29.3 |
| Acrylated epoxidized Oil | 8.6 | 11.8 |
| Additives | 1 | 5 |
| Photoinitiator blend: non-splitting type-II | 11.1 | 4.8 |
| Photoinitiator blend: splitting type-I | 2.1 | 0 |
| Black pigment mix | 19.8 | 19.8 |
| Polymeric aminobenzoate (Formula II) | 2.8 | 8 |
| Modified ketone resin (Formula I) | 0 | 21.3 |
| Conventional ketone resin (Formula III) example 2 | 21.3 | 0 |
| Properties: | | |
| Tack 150 | 248 | 287 |
| Viscosity (Pas@25° C. D = 50 1/s) | 28.9 | 33.8 |
| UV-cured with 133 mJ/cm² Optical Density 1.8; result set-off-test | 0.15 | 0.15 |

Test methods:
Tack: Measured with calibrated "Tack-o-scope" (1 ml ink @30° C. held for 90 seconds @50 rpm. then 30 seconds at 300 rpm. Then the tack value is taken @ 150 rpm)
Viscosity: Cone & plate Physika 300 Rheometer @ 25° C. (D = 2-100 1/s)

The present invention has been described in detail, including the preferred embodiments thereof. However, it be apparent to those of skill in the art, upon consideration of the present disclosure, that the invention is capable of numerous modifications, substitutions, rearrangements of parts and/or improvements without departing from the spirit and scope of the invention.

What is claimed is:

1. A photoactive resin for improving cure properties of radiation curable compositions and inks, said resin comprising:
an aromatic ketone including a biphenyl moiety; and
a chain ending group selected from hydrogen, a methylol group and mixtures thereof;
wherein the resin has the Formula I:

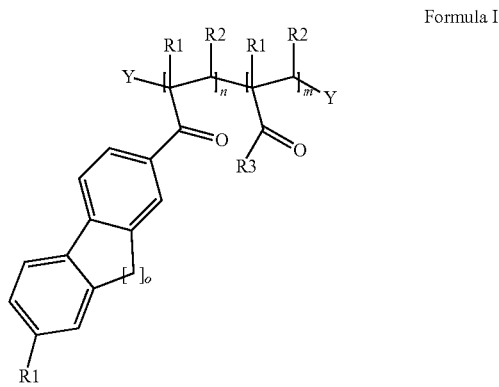

Formula I wherein
R1 is selected front hydrogen, a branched alkyl radical having 1 to 12 carbon atoms, an unbranched alkyl radical having 1 to 12 carbon atoms, a branched aromatic radical having 1 to 12 carbon atoms, and an unbranched aromatic radical having 1 to 12 carbon atoms, R2 is selected from hydrogen, a branched alkyl radical having 1 to 12 carbon atoms, an unbranched alkyl radical having 1 to 12 carbon atoms, a branched aromatic radical having 1 to 12 carbon atoms, and an unbranched aromatic radical having 1 to 12 carbon atoms, R3 is selected from an substituted, bridged, aromatic radical having 1 to 20 carbon atoms, a substituted, unbridged, aromatic radical having 1 to 20 carbon atoms, an unsubstituted, bridged, aromatic radical having 1 to 20 carbon atoms, an unsubstituted, unbridged, aromatic radical having 1 to 20 carbon atoms, a substituted, bridged, aliphatic radical having 1 to 20 carbon atoms, a substituted, unbridged, aliphatic radical having 1 to 20 carbon atoms, an unsubstituted, bridged, aliphatic radical having 1 to 20 carbon atoms, and an unsubstituted, unbridged, aliphatic radical having 1 to 20 carbon atoms, Y is said chain ending group selected from hydrogen, a methylol group and mixtures thereof, m is an integer from 0-50, n is an integer from 1-50, and o is an integer from 0-2.

2. The resin according to claim 1, having a weight average molecular weight of about 800 to 2,000.

3. The resin according to claim 1, wherein said aromatic ketone is selected 2-phenyl-propiophenone, 3-phenyl-propiophenone, 4-phenyl-propiophenone, 2-acetylfluorene, 3-acetylfluorene, 4'-methyl-4-acetyl-biphenyl, 4'-phenyl-4-acetyl-biphenyl and mixtures thereof.

4. A radiation curable composition comprising:
a mono or multi-functional acrylate;
the photoactive resin of claim 1; and
an amine.

5. The composition according to claim 4, wherein said photoactive resin has a number average molecular weight ranging from about 800 to 2,000.

6. The composition according to claim 4, wherein said acrylate is selected from: 1,4-butandiol diacrylate, 1,6-hexandiol diacrylate, dipropylene glycol diacrylate, neopentylglycol diacrylate, ethoxylated neopentylglycol diacrylates, propoxylated neopentylglycol diacrylates, tripropylene glycol diacrylate, bisphenol-A diacrylate, ethoxylated bisphenol-A-diacrylates, bisphenol-A-diglycidylether diacrylate, ethoxylated bisphenol-A-diacrylates, poly(ethylene)glycol diacrylates, trimethylolpropane triacrylate, trimethylolpropane trimethacrylate, ethoxylated trimethylolpropane triacrylates, propoxylated trimethylolpropane triacrylates, propoxylated glycerol triacrylates, pentaerythritol triacrylate, ethoxylated pentaerythritol triacrylates, propoxylated pentaerythritol tetraacrylates, ethoxylated pentaerythritol tetraacrylates, ditrimethylolpropane tetraacrylate, dipentaerythritol pentaacrylate, dipentaerythritol hexaacrylate, trimethylolpropane triacrylate and mixtures thereof.

7. The composition according to claim 6, wherein said acrylate is selected from ethoxylated pentaerythritol triacrylates, propoxylated pentaerythritol tetraacrylates, ethoxylated pentaerythritol tetraacrylates, ditrimethylolpropane tetraacrylate, dipentaerythritol pentaacrylate, dipentaerythritol hexaacrylate, trimethylolpropane triacrylate and mixtures thereof.

8. The composition according to claim 4, wherein said amine is aromatic.

9. The composition according to claim 8, wherein said amine is selected from N,N-dimethyl-4-aminobenzoic acid methylester, N,N-dimethyl-4-aminobenzoic acid ethylester, N,N-dimethyl-4-aminobenzoic acid amylester, N,N-dimethyl-4-aminobenzoic acid ethylhexylester, oligomeric aminobenzoates, and mixtures thereof.

10. The composition according to claim 9, wherein said oligomeric aminobenzoates have the formula:

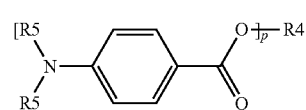

Formula II wherein,

R4 is selected from mono-, di-, tri-, tetra-, peta-, hexa- and polyvalent alkyl radicals having 1 to 50 carbon atoms and contains ethoxylated ($CH_2$—$CH_2$—O) moieties, R5 is selected from a linear, branched radical having 1 to 12 carbon atoms and can be substituted by oxygen, nitrogen or sulfur; a linear, unbranched radical having 1 to 12 carbon atoms and can be substituted by oxygen, nitrogen or sulfur; and a cyclic radical having 1 to 12 carbon atoms and can be substituted by oxygen, nitrogen or sulfur, and p is an integer from 1-50.

11. The composition according to claim 4, wherein a ratio of said aromatic ketone to said amine ranges from about 100:1 to 1:10.

12. The composition according to claim 11, wherein the ratio ranges from about 50:1 to 1:5.

13. The composition according to claim 12, wherein the ratio ranges from about 20:1 to 1:2.

14. The composition according to claim 4, wherein a ratio of acrylate to a sum of said photoactive resin and said amine ranges from about 50:15 to 1:10.

15. The composition according to claim 14, wherein said ratio ranges from about 25:1 to 1:5.

16. The composition according to claim 15, wherein said ratio ranges from about 5:1 to 1:2.

17. A method of printing comprising:
a) providing a substrate;
b) applying the radiation curable composition of claim 4; and
c) curing the applied ink on the substrate.

18. The composition according to claim 4, when measured for analytical purposes to determine extent of cure, after application of said composition on a surface of a cardboard substrate with a 12 μm wire applicator, and upon curing with a UV cure dose less than 500 mJ/cm$^2$, having a cure rating of 'Good' defined by a surface of said composition being dry and non-tacky, or a cure rating of "Fair' defined by the surface of said composition being dry yet retaining marks or fingerprints.

19. The composition according to claim 18, wherein said cure dose is less than 300 mJ/cm$^2$.

20. The composition according to claim 19, wherein said cure dose is less than 200 mJ/cm$^2$.

21. A radiation curable ink comprising:
a mono or multifunctional acrylate;
the photoactive resin of claim 1;
an amine; and
a colorant.

22. The ink according to claim 21, further comprising a photoinitiator selected from non-splitting, type II photoinitiators, splitting, type I photoinitiators, and mixtures thereof.

23. The ink according to claim 22, wherein said photoinitiator includes less than about 1 wt. % splitting, type I photoinitiators.

24. The ink according to claim 21, when measured for analytical purposes to determine extent of cure according to the IPA solvent resistance test described in ASTM D5402-06, after application of said ink on a surface of a cardboard substrate with a 12 µm wire applicator, and upon UV curing with a 200 Watt Fusion H-bulb at a line speed of 400 feet/min, a cured surface of said ink withstanding at least 5 double rubs.

25. The ink according to claim 21, wherein
said colorant is a black pigment, and
when measured for analytical purposes to determine extent of cure according to the set-off cure test, after application of said ink on a surface of a cardboard substrate with an IGT print proofer (IGT 5) at a density of 1.8, and upon UV curing with a dose of 133 mJ/cm, and subjecting a cured surface of said ink to 10 tons of pressure for 5 seconds, having a set-off value of about 0.15.

26. A method of printing comprising:
a) providing a substrate;
b) applying the ink of claim 21 to the substrate; and
c) curing the applied ink on the substrate.

27. A UV cured article comprising:
a substrate including an upper and lower surface; and
said ink according to claim 21 applied on at least one of said upper and lower surfaces of said substrate and cured with a UV radiation source.

\* \* \* \* \*